(12) United States Patent
Lee

(10) Patent No.: US 11,367,773 B2
(45) Date of Patent: Jun. 21, 2022

(54) ON-CHIP INDUCTOR STRUCTURE

(71) Applicant: VIA LABS, INC., New Taipei (TW)

(72) Inventor: Sheng-Yuan Lee, New Taipei (TW)

(73) Assignee: VIA LABS, INC., New Taipei (TW)

( * ) Notice: Subject to any disclaimer, the term of this patent is extended or adjusted under 35 U.S.C. 154(b) by 417 days.

(21) Appl. No.: 16/741,135

(22) Filed: Jan. 13, 2020

(65) Prior Publication Data

US 2021/0126085 A1 Apr. 29, 2021

(30) Foreign Application Priority Data

Oct. 24, 2019 (TW) .................................. 108138401

(51) Int. Cl.
*H01L 49/02* (2006.01)
*H01F 27/28* (2006.01)
*H01F 27/29* (2006.01)
*H01F 27/32* (2006.01)

(52) U.S. Cl.
CPC ......... *H01L 28/10* (2013.01); *H01F 27/2804* (2013.01); *H01F 27/29* (2013.01); *H01F 27/323* (2013.01); *H01F 2027/2809* (2013.01)

(58) Field of Classification Search
CPC ..... H01L 28/10; H01L 27/13; H01F 27/2804; H01F 27/29; H01F 27/323; H01F 2027/2809; H01F 2017/0073; H01F 17/0013
See application file for complete search history.

(56) References Cited

U.S. PATENT DOCUMENTS 7,705,704 B2 4/2010 Lee et al.
10,396,711 B2 * 8/2019 Wu .......................... H01F 27/29

FOREIGN PATENT DOCUMENTS

TW I371766 B 9/2012
WO WO-2019218371 A1 * 11/2019

* cited by examiner

*Primary Examiner* — Stephen E. Jones
*Assistant Examiner* — Kimberly E Glenn
(74) *Attorney, Agent, or Firm* — McClure, Qualey & Rodack, LLP

(57) ABSTRACT

An on-chip inductor structure includes first and second winding portions symmetrically arranged in an insulating layer by a symmetrical axis. Each of the first and second winding portions includes first and second semi-circular conductive lines concentrically arranged from the inside to the outside. First and second input/output conductive portions are disposed in the insulating layer along the extending direction of the symmetrical axis, to respectively and electrically couple the first ends of the outermost semi-circular conductive lines. A conductive branch structure is disposed in the insulating layer along the symmetrical axis and between the first and second input/output conductive portions, and electrically coupled to first ends of the innermost semi-circular conductive lines. The conductive branch structure has a grounded first end and a second end is electrically coupled to a circuit and is opposite the first end of the conductive branch structure.

20 Claims, 6 Drawing Sheets

ON-CHIP INDUCTOR STRUCTURE

CROSS REFERENCE TO RELATED APPLICATIONS

This application claims priority of Taiwan Patent Application No. 108138401, filed on Oct. 24, 2019, the entirety of which is incorporated by reference herein.

BACKGROUND

Field of the Disclosure

The invention relates to a semiconductor circuit, and in particular to a T-coil type on-chip inductor structure.

Description of the Related Art

Many digital/analog devices and circuits have been successfully applied to semiconductor integrated circuits. Such devices may include passive components, such as resistors, capacitors, or inductors. Typically, a semiconductor integrated circuit includes a silicon substrate. One or more dielectric layers are disposed on the substrate, with one or more metal layers disposed in the dielectric layers. The metal layers may be employed to form on-chip elements, such as T-coil type on-chip inductors, by current semiconductor technologies.

The T-coil type on-chip inductor structure may be designed from a spiral inductor with a proper branch structure. Namely, the T-coil type on-chip inductor element includes two inductors and a branch structure coupling between the windings of the two inductors, so that the on-chip inductor element forms a three-terminal device including two input/output ports and a center tap.

A current T-coil type on-chip inductor structure includes two ground-return paths, which have higher current density to induce higher coupling factor (k). However, such ground-return paths are not close to each other and hence the value of the coupling factor (k) of the inductor is greatly reduced and limited.

Due to the rapid development of communication systems, there exists a need in the art for development of a novel on-chip inductor structure capable of eliminating or mitigating the aforementioned problems.

SUMMARY

An exemplary embodiment of an on-chip inductor structure is provided. The on-chip inductor structure includes a first winding portion and a second winding portion symmetrically arranged by a symmetrical axis and disposed in an insulating layer. Each of the first and second winding portions includes a first semi-circular conductive line and a second semi-circular conductive line arranged from the inside to the outside and in concentricity. Each of the first and second semi-circular conductive lines has a first end and a second end. The on-chip inductor structure also includes a first input/output conductive portion and a second input/output conductive portion disposed in the insulating layer along an extending direction of the symmetrical axis, to respectively and electrically couple the first ends of the outermost semi-circular conductive lines. In addition, the on-chip inductor structure includes a conductive branch structure disposed in the insulating layer along the symmetrical axis and between the first input/output conductive portion and the second input/output conductive portion, and electrically coupling the first ends of the innermost semi-circular conductive lines. The conductive branch structure has a first end that is grounded, and a second end that is electrically coupled to a circuit and opposite the first end of the conductive branch structure.

BRIEF DESCRIPTION OF THE DRAWINGS

The present disclosure can be further understood by reading the subsequent detailed description and examples with references made to the accompanying drawings, wherein:

FIG. 2-1 shows a cross section along 2-2' line shown in FIG. 2 in accordance with some embodiments.

FIG. 2-2 shows a cross section along 2-2' line shown in FIG. 2 in accordance with some embodiments.

FIG. 2-3 shows a cross section along 2-2' line shown in FIG. 2 in accordance with some embodiments.

FIG. 3 is a plan view of an exemplary embodiment of an on-chip inductor structure in accordance with some embodiments.

DETAILED DESCRIPTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

Figure 1:
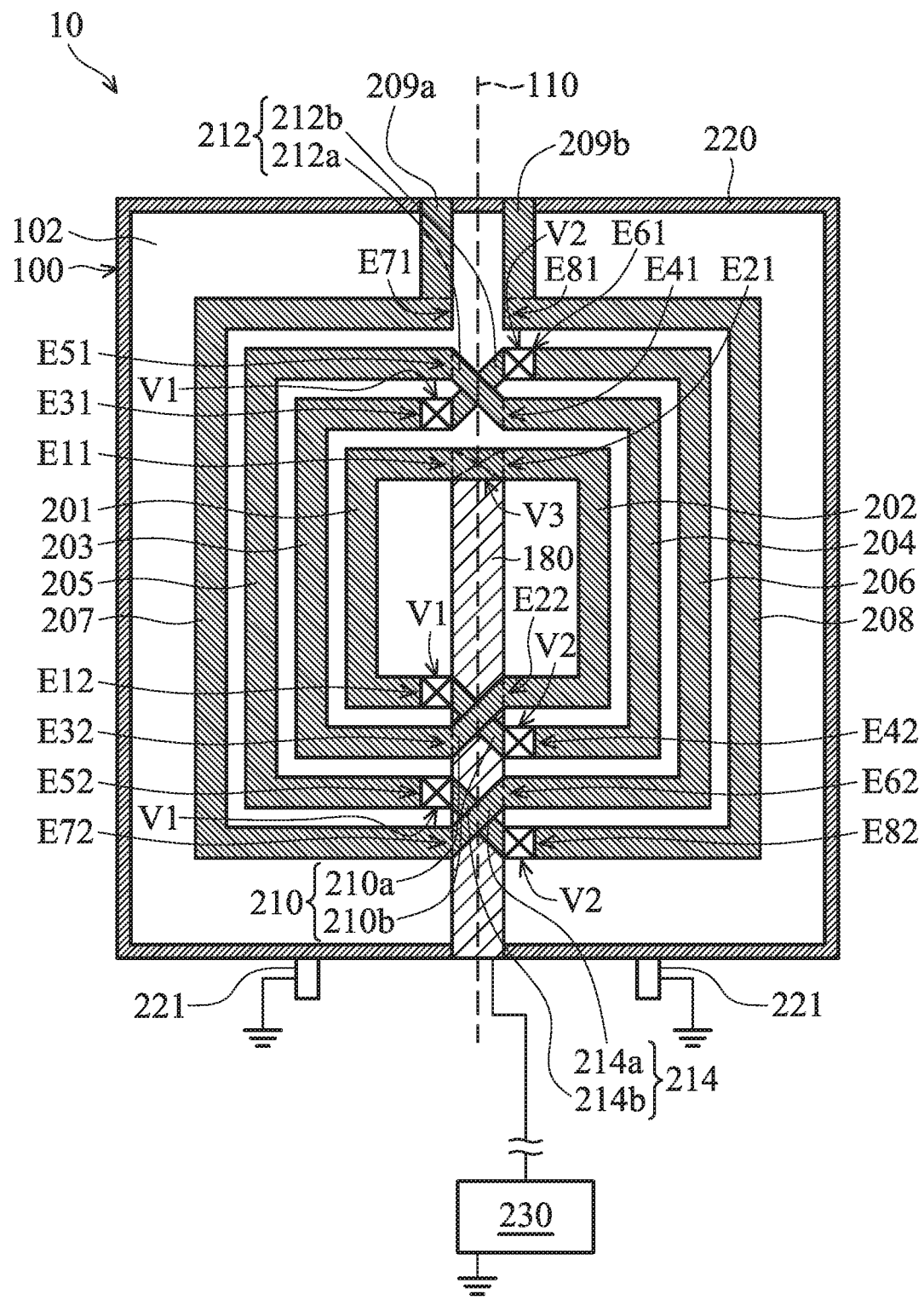
FIG. 1 is a plan view of an exemplary embodiment of an on-chip inductor structure in accordance with some embodiments.

Refer to FIG. 1, which illustrates a plan view of an exemplary embodiment of an on-chip inductor structure 10 in accordance with some embodiments. The on-chip inductor structure 10 includes a semiconductor circuit. In some embodiments, the semiconductor circuit includes a substrate 100, an insulating layer 102 disposed on the substrate 100, and conductive layers which form the inductor structure disposed in the insulating layer 102.

In some embodiments, the substrate 100 includes a silicon substrate or other semiconductor substrates known in the art. The substrate 100 may include various elements, such as transistors, resistors, capacitors or other semiconductor elements known in the art. Moreover, the substrate 100 may also include other conductive layers (e.g. copper, aluminum, or an alloy thereof) and insulating layers (e.g. silicon oxide, silicon nitride, or low-k dielectric material). Hereinafter, to simplify the diagram, only a flat substrate is depicted.

In some embodiments, the insulating layer 102 is a single dielectric layer or multi-layer dielectrics. For example, the insulating layer 102 may include multi-layer dielectrics that are successively and alternately arranged with conductive layers (not shown) over the substrate 100. In some embodiments, the insulating layer 102 includes silicon oxide, silicon nitride, or low-k dielectric material or another suitable dielectric structure.

In some embodiments, the on-chip inductor structure 10 further includes a first winding portion and a second winding portion. The first winding portion and the second winding portion are disposed in the insulating layer 102 and are symmetrically arranged by a symmetrical axis 110 (indicated by a dashed line). For example, the first winding portion is located at a first side of the symmetrical axis 110, and the second winding portion is located at a second side of the symmetrical axis 110, wherein the first side is opposite to the second site.

In some embodiments, the first winding portion located at the first side of the symmetrical axis 110 includes at least two semi-circular conductive lines arranged from the inside to the outside and in concentricity. Moreover, the second winding portion located at the second side of the symmetrical axis 110 includes corresponding semi-circular conductive lines arranged from the inside to the outside and in concentricity. For an example, the first winding portion includes semi-circular conductive lines 201, 203, 205, and 207 arranged from the inside to the outside and in concentricity. The second winding portion includes semi-circular conductive lines 202, 204, 206, and 208 arranged from the inside to the outside and in concentricity. In some embodiments, the first and second winding portions substantially form a circular, rectangular, hexagonal, octagonal, or polygonal shape. To simplify the diagram, only an exemplary rectangular shape is depicted.

In some embodiments, the first and second winding portions are defined by the uppermost conductive layer of the conductive layers formed in the insulating layer 102. For example, the first and second winding portions may be formed of a metal, such as copper, aluminum, or an alloy thereof. In some embodiments, the semi-circular conductive lines 201, 203, 205 and 207 of the first winding portion have the same line width and the same line space. Moreover, the semi-circular conductive lines 202, 204, 206 and 208 of the second winding portion also have the same line width and the same line space.

In some embodiments, the semi-circular conductive lines 201, 203, 205 and 207 respectively have corresponding first ends E11, E31, E51, and E71, and semi-circular conductive lines 202, 204, 206 and 208 respectively have corresponding first ends E21, E41, E61, and E81. Moreover, the semi-circular conductive lines 201, 203, 205 and 207 respectively have corresponding second ends E12, E32, E52, and E72, and semi-circular conductive lines 202, 204, 206 and 208 respectively have corresponding first ends E22, E42, E62, and E82. The first end E11 of the semi-circular conductive line 201 of the first winding portion extends to the first end E21 of the semi-circular conductive line 202 of the second winding portion, so as to be connected from each other. In some embodiments, the first end and the second end of the semi-circular conductive line are used for indicating two different ends, and their direction and location are not limited.

In some embodiments, the on-chip inductor structure 10 further includes one or more pairs of connection layers to electrically connect between the semi-circular conductive lines of the first and second winding portions (i.e., the semi-circular conductive lines 201, 203, 205, and 207 of the first winding portion and the semi-circular conductive lines 202, 204, 206, and 208 of the second winding portion). More specifically, the on-chip inductor structure 10 includes pairs of connection layers 210, 212, and 214. The pair of connection layers 210 includes an upper cross-connection layer 210a and a lower cross-connection layer 210b. Similarly, the pair of connection layers 212 includes an upper cross-connection layer 212a and a lower cross-connection layer 212b, and the pair of connection layers 214 includes an upper cross-connection layer 214a and a lower cross-connection layer 214b. These pairs of connection layers 210, 212, and 214 may be made of metal, such as copper, aluminum, or an alloy thereof.

In order to maintain geometric symmetry of the inductor, these pairs of connection layers 210, 212, and 214, these pairs of connection layers 210, 212, and 214 connect the first winding portion and the second portion. For example, the upper cross-connection layer 210a is connected to the second end E32 of the semi-circular conductive line 203 of the first winding portion and the second end E22 of the semi-circular conductive line 202 of the second winding portion. The lower cross-connection layer 210b is connected to the second end E12 of the semi-circular conductive line 201 of the first winding portion and the second end E42 of the semi-circular conductive line 204 of the second winding portion.

In some embodiments, the upper cross-connection layer 210a, the semi-circular conductive line 203, and the semi-circular conductive line 202 are located at the same level of the insulating layer 102. That is, the upper cross-connection layer 210a may be defined by the uppermost conductive layer. In some embodiments, the lower cross-connection layer 210b is in the insulating layer 102 below the upper cross-connection layer 210a. That is, the lower cross-connection layer 210b may be defined by the conductive layer below the uppermost conductive layer.

Moreover, the lower cross-connection layer 210b may be electrically connected to the semi-circular conductive line 201 and the semi-circular conductive line 204 via the conductive plug V1 below the second end E12 of the semi-circular conductive line 201 and the conductive plug V2 below the second end E42 of the semi-circular conductive line 204.

Similarly, the upper cross-connection layer 212a is connected to the first end E51 of the semi-circular conductive line 205 of the first winding portion and the first end E41 of the semi-circular conductive line 204 of the second winding portion. The lower cross-connection layer 212b is connected to the first end E31 of the semi-circular conductive line 203 of the first winding portion and the first end E61 of the semi-circular conductive line 206 of the second winding portion.

In some embodiments, the upper cross-connection layer 212a, the semi-circular conductive line 205, and the semi-circular conductive line 204 are located at the same level of the insulating layer 102. That is, the upper cross-connection layer 212a may be defined by the uppermost conductive layer. In some embodiments, the lower cross-connection layer 212b is in the insulating layer 102 below the upper cross-connection layer 212a. That is, the lower cross-connection layer 212b may be defined by the conductive layer below the uppermost conductive layer.

Moreover, the lower cross-connection layer 212b may be electrically connected to the semi-circular conductive line 203 and the semi-circular conductive line 206 via the conductive plug V1 below the first end E31 of the semi-circular conductive line 203 and the conductive plug V2 below the first end E61 of the semi-circular conductive line 206.

In addition, the upper cross-connection layer 214a is connected to the second end E72 of the semi-circular conductive line 207 of the first winding portion and the second end E62 of the semi-circular conductive line 206 of the second winding portion. The lower cross-connection layer 214b is connected to the second end E52 of the semi-circular conductive line 205 of the first winding portion and the second end E82 of the semi-circular conductive line 208 of the second winding portion.

In some embodiments, the upper cross-connection layer 214a, the semi-circular conductive line 207, and the semi-circular conductive line 206 are located at the same level of the insulating layer 102. That is, the upper cross-connection layer 214a may be defined by the uppermost conductive layer. In some embodiments, the lower cross-connection layer 214b is in the insulating layer 102 below the upper cross-connection layer 214a. That is, the lower cross-connection layer 214b may be defined by the conductive layer below the uppermost conductive layer.

Moreover, the lower cross-connection layer 214b may be electrically connected to the semi-circular conductive line 205 and the semi-circular conductive line 208 via the conductive plug V1 below the second end E52 of the semi-circular conductive line 205 and the conductive plug V2 below the second end E82 of the semi-circular conductive line 208.

In some embodiments, the on-chip inductor structure 10 further includes a first input/output conductive portion 209a and a second input/output conductive portion 209b. More specifically, the first end E71 of the semi-circular conductive line 207 of the first winding portion and the first end E81 of the semi-circular conductive line 208 of the second winding portion respectively have the laterally extended first input/output conductive portion 209a and the laterally extended second input/output conductive portion 209b. In some embodiments, the first input/output conductive portion 209a and the second input/output conductive portion 209b respectively connect the first end E71 of the semi-circular conductive line 207 and the first end E81 of the semi-circular conductive line 208 along the direction of the symmetrical axis 110, to sever as ports for inputting/outputting signals. In some embodiments, the semi-circular conductive line 207 and the semi-circular conductive line 208 are the outermost semi-circular conductive lines.

In some embodiments, the first input/output conductive portion 209a and the second input/output conductive portion 209b are disposed in the insulating layer 102 and located at the same level of the insulating layer 102 as that of the semi-circular conductive line 207 and the semi-circular conductive line 208. That is, the first input/output conductive portion 209a and the second input/output conductive portion 209b may be defined by the uppermost conductive layer.

In some embodiments, the on-chip inductor structure 10 further includes a conductive branch structure 180 disposed in the insulating layer 102 and at the symmetrical axis 110. In some embodiments, the conductive branch structure 180 is a continuous single layer structure and electrically coupled to the first end E11 of the semi-circular conductive line 201 and the first end E21 of the semi-circular conductive line 202. More specifically, the conductive branch structure 180 extends beyond the second end E72 of the semi-circular conductive line 207 and the second end E82 of the semi-circular conductive line 208 from the first ends E11 and E21 along the symmetrical axis 110. In some embodiments, the semi-circular conductive line 201 and the semi-circular conductive line 202 are innermost semi-circular conductive lines.

In some embodiments, the conductive branch structure 180 is disposed in the insulating layer 102 below the pairs of connection layers 210, 212, and 214. That is, the conductive branch structure 180 may be defined by the conductive layer below the lower cross-connection layers 210b, 212b, and 214b. In some embodiments, the conductive branch structure 180 has a line width greater than or equal to the line widths of the semi-circular conductive lines 201, 203, 205, and 207 of the first winding portion and the line widths of the semi-circular conductive lines 202, 204, 206, and 208 of the second winding portion.

In some embodiments, the semi-circular conductive lines 201, 203, 205, 207, 202, 204, 206, and 208 have substantially the same line width and substantially the same thickness. Moreover, the cross sections of the semi-circular conductive lines 201, 203, 205, 207, 202, 204, 206, and 208 are greater than the cross section of the conductive branch structure 180. The term "cross section" refers to an area of the semi-circular conductive line perpendicular to the direction of the current in the inductor. Herein, in order to reduce the conductor loss of the semi-circular conductive lines, the line width of the conductive branch structure 180 is greater than the line widths of the semi-circular conductive lines 201, 203, 205, and 207 of the first winding portion and the line widths of the semi-circular conductive lines 202, 204, 206, and 208 of the second winding portion. As a result, the Q value of the inductor can be increased.

In some embodiments, a first end of the conductive branch structure 180 is electrically connected to the semi-circular conductive lines 201 and 202 via the conductive plug V3 below the semi-circular conductive lines 201 and 202. Moreover, a second end of the conductive branch structure 180 is electrically coupled to a circuit 230 (indicated by a block, as shown in FIG. 1). In addition, the circuit 230 is coupled to a ground terminal. As a result, the first input/output conductive portion 209a, the semi-circular conductive lines 207, 206, 203, 202 of the first and second winding portions, and the conductive branch structure 180 forms an inductor path. Moreover, the circuit 230 that is coupled to the conductive branch structure 180, the ground terminal that is coupled to the circuit 230, and the first input/output conductive portion 209a form a ground return path. Similarly, the second input/output conductive portion 209b, the semi-circular conductive lines 208, 205, 204, 201 of the first and second winding portions, and the conductive branch structure 180 forms another inductor path. Moreover, the circuit 230 that is coupled to the conductive branch structure 180, the ground terminal that is coupled to the circuit 230, and the second input/output conductive portion 209b form another ground return path. Since these two ground return paths are substantially formed on both sides of the symmetrical axis 110 and far away from each other, the value of the coupling factor is limited.

In some embodiments, the on-chip inductor structure 10 further includes a guard ring 220 disposed in the insulating layer 102. As viewed from a top-view perspective, the guard ring 220 surrounds the first and second winding portions (i.e., the semi-circular conductive lines 201, 203, 205, 207, 202, 204, 206, and 208). In some embodiments, the guard ring 220 is formed at a level of the insulating layer 102 that is below the conductive branch structure 180. Moreover, the guard ring 220 is grounded or electrically coupled to a ground terminal in the substrate 100 via a conductive pad or electrode 221.

Figure 2:
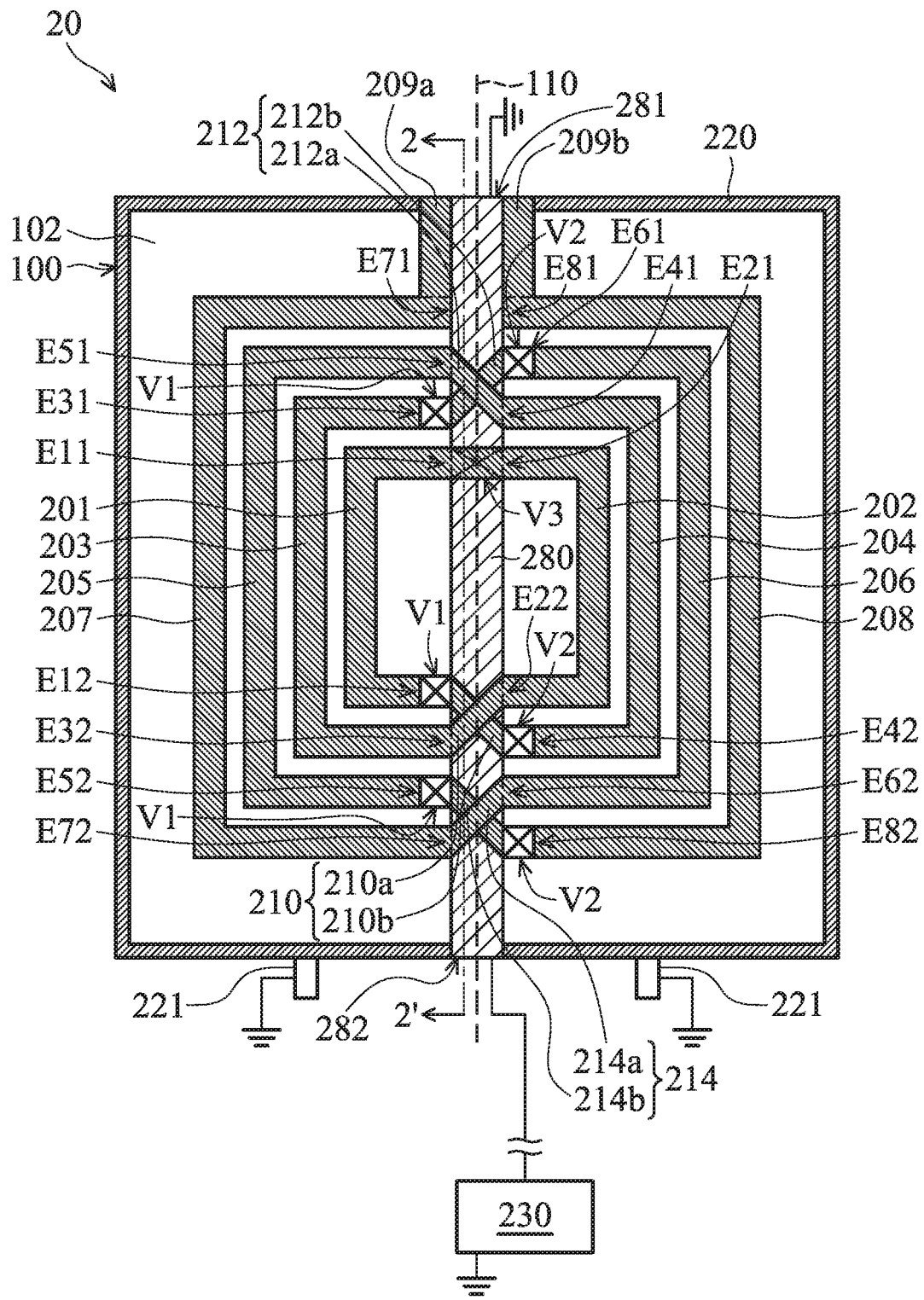
FIG. 2 is a plan view of an exemplary embodiment of an on-chip inductor structure in accordance with some embodiments.
Figures 1, 2:
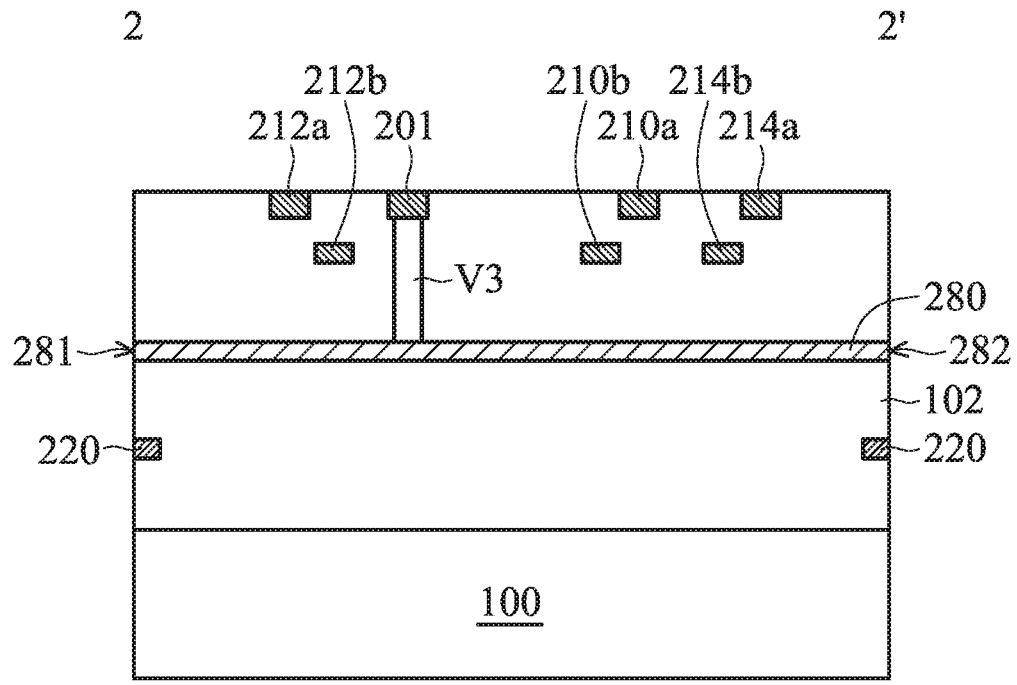
Figure 2:
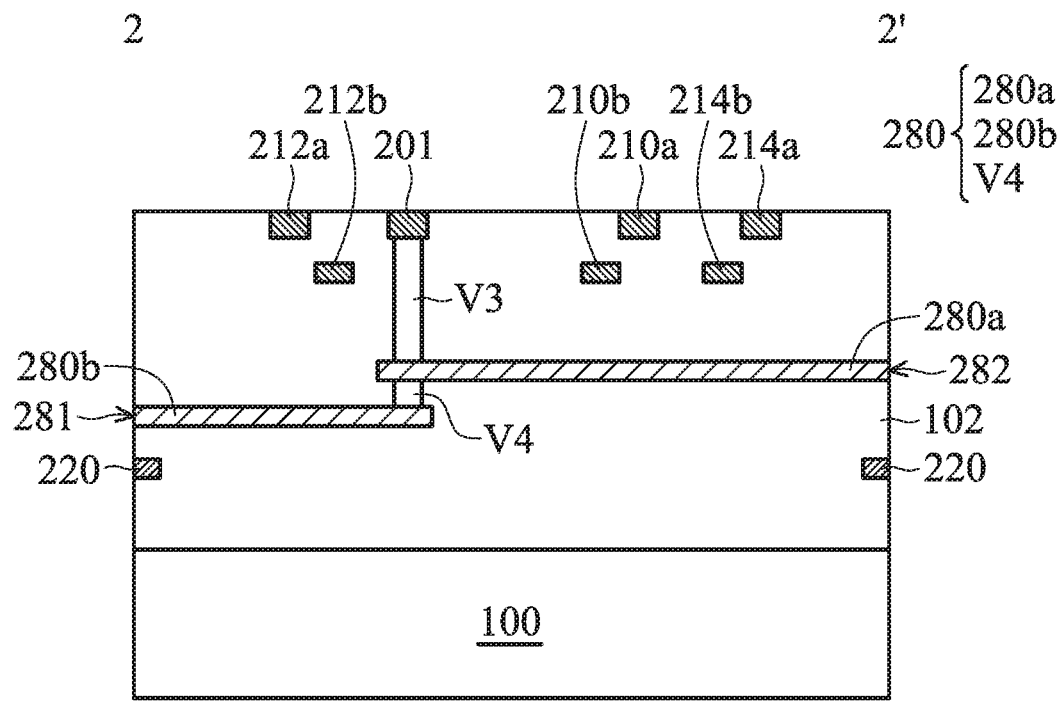

FIGS. 2 and 2-1 illustrate an on-chip inductor structure 20 in accordance with some embodiments, in which FIG. 2 is a plan view of an exemplary embodiment of an on-chip inductor structure 20 in accordance with some embodiments, and FIG. 2-1 shows a cross section along 2-2' line shown in FIG. 2 in accordance with some embodiments. Elements in FIGS. 2 and 2-1 that are the same as those of the on-chip inductor structure 10 in FIG. 1 are labeled with the same reference numbers as in FIG. 1 and are not described again. The on-chip inductor structure 20 has a structure that is similar to the structure of the on-chip inductor structure 10 shown in FIG. 1. More specifically, similar to the conductive branch structure 180 of the on-chip inductor structure 10 shown in FIG. 1, the conductive branch structure 280 of the on-chip inductor structure 20 is at the symmetrical axis 110. Moreover, the conductive branch structure 280 is a continuous single layer structure and is electrically coupled to the first end E11 of the semi-circular conductive line 201 and the first end E21 of the semi-circular conductive line 202.

However, unlike the conductive branch structure 180 shown in FIG. 1, the conductive branch structure 280 extends below the first input/output conductive portion 209a and the second input/output conductive portion 209b along the symmetrical axis 110, so that a portion of the conductive branch structure 280 is formed between the first input/output conductive portion 209a and the second input/output conductive portion 209b.

In some embodiments, the conductive branch structure 280 between the first input/output conductive portion 209a and the second input/output conductive portion 209b has a first end 281. Moreover, the conductive branch structure 280 has a second end 282 opposite the first end 281 of the conductive branch structure 280. The first end 281 of the conductive branch structure 280 is grounded via other circuits (not shown), and the second end 282 of the conductive branch structure 280 is coupled to a circuit 230. In some embodiments, the first end 281 of the conductive branch structure 280 is directly grounded without via other circuits. As a result, the first input/output conductive portion 209a, the corresponding first and second winding portions (the semi-circular conductive lines 207, 206, 203, 202) connected to the first input/output conductive portion 209a, and the conductive branch structure 280 between the first input/output conductive portion 209a and the second input/output conductive portion 209b form an inductor path. The first end 281 of the conductive branch structure 280, the grounded terminal coupled to the first end 281, and the first input/output conductive portion 209a form a ground-return path. In addition, in some embodiments, the first end and the second end of the conductive branch structure 280 are used for indicating two different ends, and their direction and location are not limited.

Similarly, the second input/output conductive portion 209b, the corresponding first and second winding portions (the semi-circular conductive lines 208, 205, 204, 201) connected to the second input/output conductive portion 209b, and the conductive branch structure 280 between the first input/output conductive portion 209a and the second input/output conductive portion 209b form another inductor path. The first end 281 of the conductive branch structure 280, the grounded terminal coupled to the first end 281, and the second input/output conductive portion 209b form another ground-return path. Compared to the two formed ground-return paths shown in FIG. 1, the two formed ground-return paths shown in FIG. 2 (which are near to the first input/output conductive portion 209a and the second input/output conductive portion 209b) are close to each other. Moreover, the respective ground-return paths are shorter. Therefore, the coupling factor (k) of the inductor can be effectively increased.

Refer to FIG. 2-2, which shows a cross section along 2-2' line shown in FIG. 2 in accordance with some embodiments. Elements in FIG. 2-2 that are the same as those in FIG. 2-1 are labeled with the same reference numbers as in FIG. 2-1 and are not described again. The structure shown in FIG. 2-2 is similar to the structure shown in FIG. 2-1. The difference is the conductive branch structure 280 in FIG. 2-2 has a multilayer structure that includes a first branch portion 280a, a second branch portion 280b, and a conductive plug V4.

In some embodiments, the first branch portion 280a extends toward the second end E12 of the semi-circular conductive line 201 and the second end E22 of the semi-circular conductive line 202 from the first end E11 of the semi-circular conductive line 201 and the first end E21 of the semi-circular conductive line 202. Moreover, the second branch portion 280b extends toward the first end E31 of the semi-circular conductive line 203 and the first end E41 of the semi-circular conductive line 204 from the first end E11 of the semi-circular conductive line 201 and the first end E21 of the semi-circular conductive line 202. As shown in FIG. 2-2, the first branch portion 280a is vertically located at a level of the insulating layer 102 between the second branch portion 280b and the pairs of connection layers 210, 212, and 214. Moreover, the first branch portion 280a and the second branch portion 280b are electrically coupled to each other via the conductive plug V4 below the conductive plug V3.

In some other embodiments, the second branch portion 280b is vertically located at a level of the insulating layer 102 between the first branch portion 280a and the pairs of connection layers 210, 212, and 214. Similar to the conductive branch structure 280 shown in FIG. 2-2, the first branch portion 280a and the second branch portion 280b are electrically coupled to each other via the conductive plug V4 below the conductive plug V3, as shown in FIG. 2-3.

Figures 2, 3:
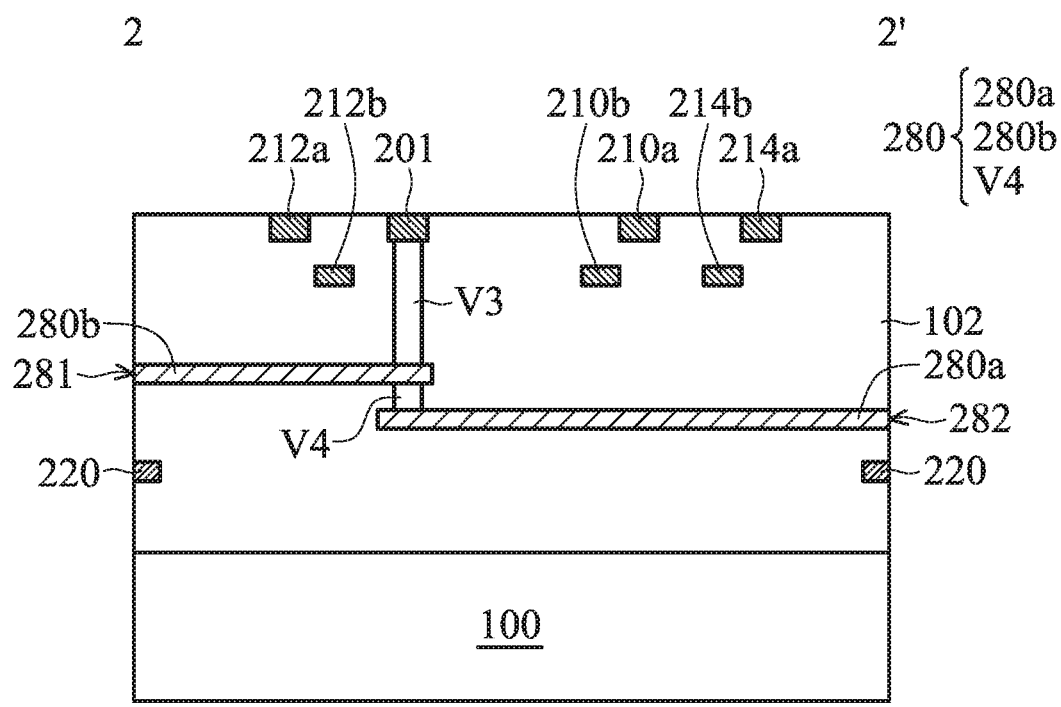
Figure 3:
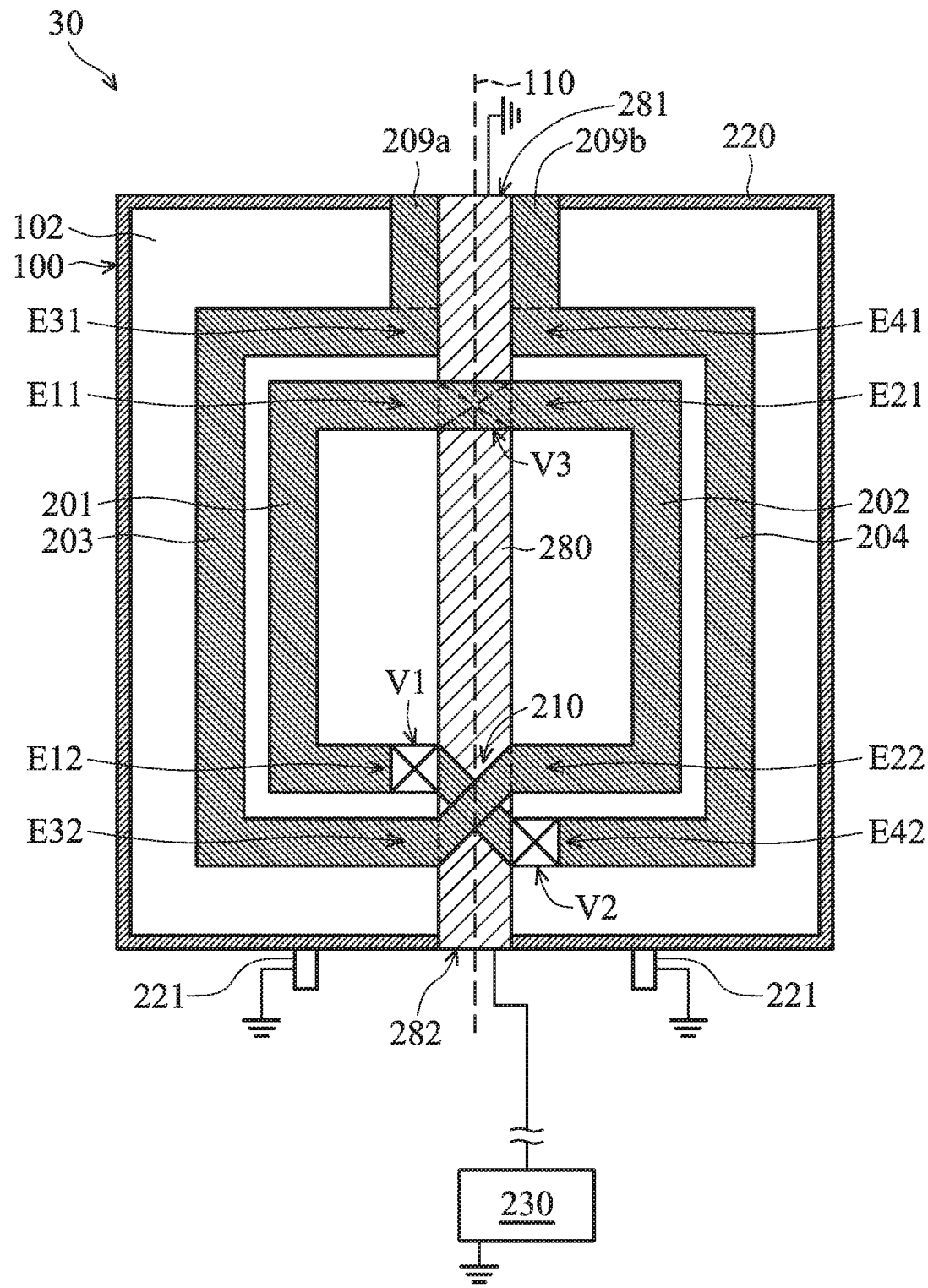

Refer to FIG. 3, which illustrates a plan view of an exemplary embodiment of an on-chip inductor structure 30 in accordance with some embodiments. Elements in FIG. 3 that are the same as those in FIG. 2 are labeled with the same reference numbers as in FIG. 2 and are not described again. The on-chip inductor structure 30 has a structure that is similar to the structure of the on-chip inductor structure 20 shown in FIG. 2. Unlike the on-chip inductor structure 20 shown in FIG. 2, the on-chip inductor structure 30 includes a first winding portion and a second winding portion. The first winding portion that is located on the first side of the symmetrical axis 110 includes two semi-circular conductive lines arranged from the inside to the outside and in concentricity. Moreover, the second portion that is located on the second side of the symmetrical axis 110 includes corresponding semi-circular conductive lines arranged from the inside to the outside and in concentricity.

For an example, the first winding portion that includes semi-circular conductive lines 201 and 203 arranged from the inside to the outside and in concentricity. The second winding portion that includes semi-circular conductive lines 202 and 204 concentrically arranged from the inside to the outside. Moreover, the on-chip inductor structure 30 includes a pair of connection layers 210 that is disposed in the insulating layer 102, connected to the second end E12 of the semi-circular conductive line 201 of the first winding portion and the second end E42 of the semi-circular conductive line 204 of the second winding portion, and connected to the second end E32 of the semi-circular conductive line 203 of the first winding portion and the second end E22 of the semi-circular conductive line 202 of the second winding portion.

In addition, a first input/output conductive portion 209a and a second input/output conductive portion 209b are respectively connected to the first end E31 of the semi-circular conductive line 203 and the first end E41 of the semi-circular conductive line 204 along the direction of the symmetrical axis 110. In some embodiments, the semi-circular conductive line 203 and the semi-circular conductive line 204 are the outermost semi-circular conductive lines. A conductive branch structure 280 extends beyond the first end E31 and the second end E32 of the semi-circular conductive line 203, and the first end E41 and the second end E42 of the semi-circular conductive line 204, so that a portion of the conductive branch structure 280 between the first input/output conductive portion 209a and the second input/output conductive portion 209b. The conductive branch structure 280 between the first input/output conductive portion 209a and the second input/output conductive portion 209b has a first end 281. In some embodiments, the first end 281 of the conductive branch structure 280 is directly grounded without via other circuits. In some embodiments, the first end 281 of the conductive branch structure 280 is grounded via other circuits (not shown).

Figure 4:
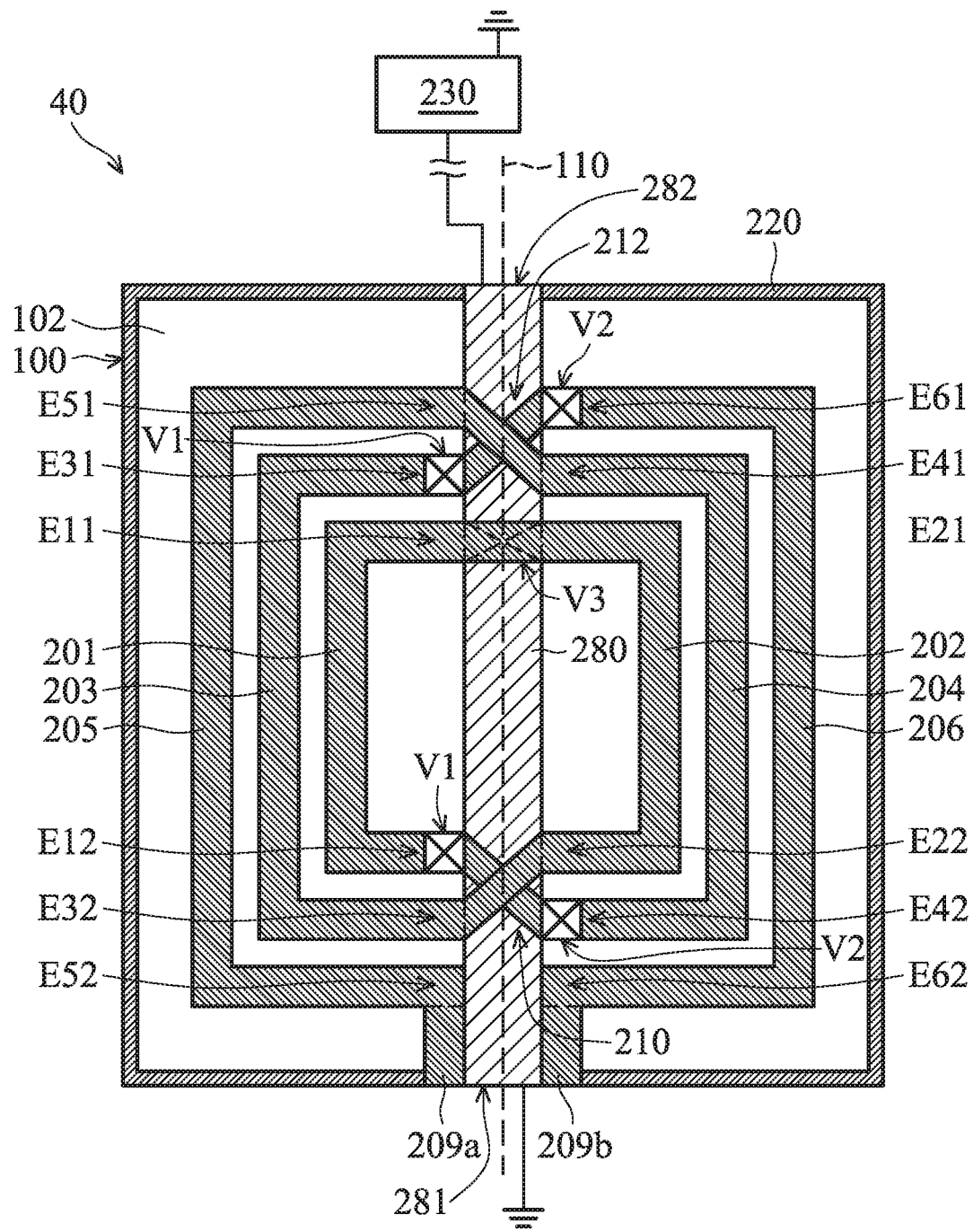
FIG. 4 is a plan view of an exemplary embodiment of an on-chip inductor structure in accordance with some embodiments.

Refer to FIG. 4, which illustrates a plan view of an exemplary embodiment of an on-chip inductor structure 40 in accordance with some embodiments. Elements in FIG. 4 that are the same as those in FIG. 2 are labeled with the same reference numbers as in FIG. 2 and are not described again. The on-chip inductor structure 40 has a structure that is similar to the structure of the on-chip inductor structure 20 shown in FIG. 2. Unlike the on-chip inductor structure 20 shown in FIG. 2, the on-chip inductor structure 40 includes a first winding portion and a second winding portion. The first winding portion that is located on the first side of the symmetrical axis 110 includes three semi-circular conductive lines arranged from the inside to the outside and in concentricity. Moreover, the second portion that is located on the second side of the symmetrical axis 110 includes corresponding semi-circular conductive lines arranged from the inside to the outside and in concentricity.

For an example, the first winding portion that includes semi-circular conductive lines 201, 203, and 205 arranged from the inside to the outside and in concentricity. The second winding portion that includes semi-circular conductive lines 202, 204, and 206 arranged from the inside to the outside and in concentricity. Moreover, the on-chip inductor structure 40 includes two pairs of connection layers 210 and 212 that are disposed in the insulating layer 102. The pair of connection layers 210 is connected to the second end E12 of the semi-circular conductive line 201 of the first winding portion and the second end E42 of the semi-circular conductive line 204 of the second winding portion, and connected to the second end E32 of the semi-circular conductive line 203 of the first winding portion and the second end E22 of the semi-circular conductive line 202 of the second winding portion. The pair of connection layers 212 is connected to the first end E31 of the semi-circular conductive line 203 of the first winding portion and the first end E61 of the semi-circular conductive line 206 of the second winding portion, and connected to the first end E51 of the semi-circular conductive line 205 of the first winding portion and the first end E41 of the semi-circular conductive line 204 of the second winding portion. In addition, in some embodiments, the first end and the second end of the semi-circular conductive line are used for indicating two different ends, and their direction and location are limited. For example, the first end E51 and the second end E52 of the semi-circular conductive line 205 of the first winding portion can be changed to the first end E52 and the second end E51 of the semi-circular conductive line 205 of the first winding portion. The first end E61 and the second end E62 of the semi-circular conductive line 206 of the second winding portion can be changed to the first end E62 and the second end E61 of the semi-circular conductive line 205 of the first winding portion.

In addition, a first input/output conductive portion 209a and a second input/output conductive portion 209b are respectively connected to the second end E52 of the semi-circular conductive line 205 and the second end E62 of the semi-circular conductive line 206 along the direction of the symmetrical axis 110, so that a portion of the conductive branch structure 280 between the first input/output conductive portion 209a and the second input/output conductive portion 209b. In some embodiments, the semi-circular conductive line 205 and the semi-circular conductive line 206 are the outermost semi-circular conductive lines. The conductive branch structure 280 between the first input/output conductive portion 209a and the second input/output conductive portion 209b has a first end 281. Moreover, the conductive branch structure 280 has a second end 282 opposite the first end 281 of the conductive branch structure 280. The first end 281 of the conductive branch structure 280 is grounded, and the second end 282 of the conductive branch structure 280 is coupled to a circuit 230. In some embodiments, the first end 281 of the conductive branch structure 280 is directly grounded without via other circuits. In some embodiments, the first end 281 of the conductive branch structure 280 is grounded via other circuits (not shown).

According to the on-chip inductor structure of the foregoing embodiments, the conductive branch structure has a dual terminal structure (i.e., a dual center tap, as the mentioned first and second ends). The conductive branch structure includes a first center tap (i.e., the first end that is grounded) near to the first input/output conductive portion and the second input/output conductive portion. As a result, the two formed ground return paths are close to each other, thereby effectively increasing the coupling factor k of the inductor.

Moreover, the conductive branch structure includes a second center tap opposite the first center tap (the second end opposite the grounded end). The second center tap still can be electrically coupled to a desired circuit. Therefore, the design flexibility of the on-chip inductor structure can be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An on-chip inductor structure, comprising:
a first winding portion and a second winding portion, symmetrically arranged by a symmetrical axis and disposed in an insulating layer, each of the first and second winding portions comprising a first semi-circular conductive line and a second semi-circular conductive line concentrically arranged from the inside to the outside, each of the first and second semi-circular conductive lines having a first end and a second end;

a first input/output conductive portion and a second input/output conductive portion disposed in the insulating layer along an extending direction of the symmetrical axis, to respectively and electrically couple the first ends of the outermost semi-circular conductive lines; and a conductive branch structure disposed in the insulating layer along the symmetrical axis and between the first input/output conductive portion and the second input/output conductive portion, electrically coupling the first ends of the innermost semi-circular conductive lines, wherein the conductive branch structure has a first end that is grounded, and a second end that is electrically coupled to a circuit and opposite the first end of the conductive branch structure.

2. The on-chip inductor structure as claimed in claim 1, wherein the first end of the first semi-circular conductive line of the first winding portion is connected to the first end of the first semi-circular conductive line of the second winding portion, and the first semi-circular conductive lines are the innermost semi-circular conductive lines.

3. The on-chip inductor structure as claimed in claim 1, further comprising:
a first pair of connection layers disposed in the insulating layer, connecting the second end of the first semi-circular conductive line of the first winding portion to the second end of the second semi-circular conductive line of the second winding portion, and connecting the second end of the second semi-circular conductive line of the first winding portion to the second end of the first semi-circular conductive line of the second winding portion.

4. The on-chip inductor structure as claimed in claim 3, wherein the first pair of connection layers comprises an upper cross-connection layer and a lower cross-connection layer.

5. The on-chip inductor structure as claimed in claim 3, wherein the innermost semi-circular conductive lines are the first semi-circular conductive lines and the conductive branch structure comprises:
a first branch portion extending from the first ends of the first semi-circular conductive lines toward the second ends of the first semi-circular conductive lines; and
a second branch portion extending from the first ends of the first semi-circular conductive lines toward the first ends of the second semi-circular conductive lines.

6. The on-chip inductor structure as claimed in claim 5, wherein the first branch portion is disposed in a level of the insulating layer between the second branch portion and the first pair of connection layers.

7. The on-chip inductor structure as claimed in claim 5, wherein the second branch portion is disposed in a level of the insulating layer between the first branch portion and the first pair of connection layers.

8. The on-chip inductor structure as claimed in claim 5, wherein the conductive branch structure extends beyond the first ends and the second ends of the second semi-circular conductive lines.

9. The on-chip inductor structure as claimed in claim 1, wherein the conductive branch structure is a continuous single layer structure.

10. The on-chip inductor structure as claimed in claim 1, wherein the first semi-circular conductive lines and the second semi-circular conductive lines of the first and second winding portions have the same line width.

11. The on-chip inductor structure as claimed in claim 10, wherein the conductive branch structure has a line width that is greater than or equal to the line widths of the first and second semi-circular conductive lines.

12. The on-chip inductor structure as claimed in claim 1, wherein the first and second winding portions form a circular, rectangular, hexagonal, octagonal, or polygonal shape.

13. The on-chip inductor structure as claimed in claim 1, further comprising a guard ring disposed in the insulating layer, wherein the guard ring surrounds the first and second winding portions, as viewed from a top-view perspective.

14. The on-chip inductor structure as claimed in claim 13, wherein the guard ring is disposed in a level of the insulating layer below the conductive branch structure.

15. The on-chip inductor structure as claimed in claim 1, wherein each of the first and second winding portions further comprises a third semi-circular conductive line and a fourth semi-circular conductive line concentrically arranged from the inside to the outside and located at outside of the second semi-circular conductive line, and wherein the on-chip inductor structure further comprises:
a second pair of connection layers disposed in the insulating layer, connecting the second end of the third semi-circular conductive line of the first winding portion to the second end of the fourth semi-circular conductive line of the second winding portion, and connecting the second end of the fourth semi-circular conductive line of the first winding portion to the second end of the third semi-circular conductive line of the second winding portion; and
a third pair of connection layers disposed in the insulating layer, connecting the first end of the third semi-circular conductive line of the first winding portion to the first end of the second semi-circular conductive line of the second winding portion, and connecting the first end of the second semi-circular conductive line of the first winding portion to the first end of the third semi-circular conductive line of the second winding portion.

16. The on-chip inductor structure as claimed in claim 15, wherein the first input/output conductive portion and the second input/output conductive portion are respectively connected to the first ends of the fourth semi-circular conductive lines, and the fourth semi-circular conductive lines are the outermost semi-circular conductive lines.

17. The on-chip inductor structure as claimed in claim 16, wherein the first, second, third, and fourth semi-circular conductive lines of the first and second winding portions have the same line width, and the conductive branch portion has a line width that is greater than or equal to the line widths of the first, second, third, and fourth semi-circular conductive lines.

18. The on-chip inductor structure as claimed in claim 1, wherein each of the first and second winding portions further comprises a third semi-circular conductive line concentrically arranged outside of the second semi-circular conductive line, wherein a first end of the third semi-circular conductive line is at a different side from the first ends of the first and second semi-circular conductive lines, and a second end of the third semi-circular conductive line is at a different side from the second ends of the first and second semi-circular conductive lines, and wherein the on-chip inductor structure further comprises:
a first pair of connection layers disposed in the insulating layer, connecting the second end of the first semi-circular conductive line of the first winding portion to the second end of the second semi-circular conductive line of the second winding portion, and connecting the second end of the second semi-circular conductive line of the first winding portion to the second end of the first semi-circular conductive line of the second winding portion; and a second pair of connection layers disposed in the insulating layer, connecting the second end of the third semi-circular conductive line of the first winding portion to the first end of the second semi-circular conductive line of the second winding portion, and connecting the first end of the second semi-circular conductive line of the first winding portion to the second end of the third semi-circular conductive line of the second winding portion.

19. The on-chip inductor structure as claimed in claim 18, wherein the first input/output conductive portion and the second input/output conductive portion respectively connected to the first ends of the third semi-circular conductive lines, and the third semi-circular conductive lines are the outermost semi-circular conductive lines.

20. The on-chip inductor structure as claimed in claim 18, wherein the first end of the conductive branch structure is adjacent to the first ends of the third semi-circular conductive lines.

* * * * *